(12) United States Patent
Katayama

(10) Patent No.: US 7,911,852 B2
(45) Date of Patent: Mar. 22, 2011

(54) NONVOLATILE SEMICONDUCTOR MEMORY DEVICE AND OPERATION METHOD THEREOF

(75) Inventor: Kozo Katayama, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 86 days.

(21) Appl. No.: 12/442,024

(22) PCT Filed: Sep. 25, 2007

(86) PCT No.: PCT/JP2007/068504
§ 371 (c)(1),
(2), (4) Date: Mar. 19, 2009

(87) PCT Pub. No.: WO2008/041536
PCT Pub. Date: Apr. 10, 2008

(65) Prior Publication Data
US 2010/0074029 A1 Mar. 25, 2010

(30) Foreign Application Priority Data
Oct. 2, 2006 (JP) .................. 2006-270732

(51) Int. Cl.
*G11C 11/34* (2006.01)
(52) U.S. Cl. .............. 365/185.29; 365/185.24
(58) Field of Classification Search ............. 365/185.29, 365/185.24
See application file for complete search history.

(56) References Cited

U.S. PATENT DOCUMENTS

| 2004/0214379 A1* | 10/2004 | Lee et al. ............. 438/149 |
| 2005/0006698 A1 | 1/2005 | Matsuzaki et al. |
| 2006/0033146 A1* | 2/2006 | Wang ................ 257/315 |
| 2006/0186462 A1 | 8/2006 | Han et al. |

FOREIGN PATENT DOCUMENTS

| JP | 09-036265 | 2/1997 |
| JP | 2005-011490 | 1/2005 |
| JP | 2005-197531 | 7/2005 |
| JP | 2006-237604 | 9/2006 |

OTHER PUBLICATIONS

Lee, Chang-Hyun et al., "Charge Trapping Memory Cell of TANOS (Si-Oxide-SiN-Al$_2$O$_3$-TaN) Structure Compatible to Conventional NAND Flash Memory," IEEE Nonvolatile Semiconductor Memory Workshop 2006, pp. 54-55.

(Continued)

*Primary Examiner* — Michael T Tran
(74) *Attorney, Agent, or Firm* — McDermott Will & Emery LLP

(57) ABSTRACT

A p-type well region is formed at a main surface of a semiconductor substrate. An n-type impurity region is located under the p-type well region. A first insulating layer is formed on the main surface of the semiconductor substrate and on the p-type well region. A charge-storage insulating layer is formed on the first insulating layer. A gate electrode layer is formed on the charge-storage insulating layer. An erase operation is performed by applying a forward bias to the p-type well region and the n-type impurity region to generate hot carriers and inject the hot carriers into the charge-storage insulating layer.

6 Claims, 16 Drawing Sheets

Erase

OTHER PUBLICATIONS

Lee, Chang-Hyun et al. "A Novel SONOS Structure of $SiO_2$/SiN/$Al_2O_3$ with TaN Metal Gate for Multi-Giga Bit Flash Memories," IEDM 2003 Tech. Digest, pp. 613-616, Dec. 2003.

Lue, Hang-Ting et al. "BE-SONOS: A Bandgap Engineered SONOS with Excellent Performance and Reliability," IEDM 2005 Tech. Digest, pp. 555-558, Dec. 2005.

Likahrev, Konstantin K. et al., :Layered tunnel barriers for nonvolatile memory devices, Appl. Phys. Letters, 73 (1998), pp. 2137-2139.

* cited by examiner

Program "1" (low Vt)

Read

WRITE

NONVOLATILE SEMICONDUCTOR MEMORY DEVICE AND OPERATION METHOD THEREOF

RELATED APPLICATIONS

This application is the U.S. National Phase under 35 U.S.C. §371 of International Application No. PCT/JP2007/068504, filed on Sep. 25, 2007, which in turn claims the benefit of Japanese Application No. 2006-270732, filed on Oct. 2, 2006, the disclosures of which Applications are incorporated by reference herein.

TECHNICAL FIELD

The present invention relates to a nonvolatile semiconductor memory device and an operation method thereof, and particularly to a nonvolatile semiconductor memory device performing erase and write operations by injecting and removing an electric charge into and from a charge-storage insulating layer as well as an operation method of the nonvolatile semiconductor memory device.

BACKGROUND ART

Flash memory is one type of the nonvolatile semiconductor memory device. The transistor technology for the flash memory is generally divided into a floating gate technology and a MONOS (Metal-Oxide-Nitride-Oxide-Silicon) technology. The floating gate technology uses a transistor including a gate electrode with a double layer structure where a control gate is laid on a floating gate. In a floating-gate-type flash memory, the capacitive coupling between floating gates adjacent to each other increases as the memory is downsized, and therefore, further scaling is difficult. Accordingly, the MONOS technology without gate-to-gate coupling has become of interest.

The MONOS technology uses a transistor including a gate with a MONOS (metal/oxide film/nitride film/oxide film/silicon) structure. An electric charge is injected into and held at a trapping level present in this oxide film/nitride film/oxide film structure. Flash memories using this MONOS technology are disclosed for example in Non-Patent Documents 1 to 3.

Non-Patent Documents 1 and 2 disclose a charge trapping memory cell with a TANOS (TaN—$Al_2O_3$—SiN-Oxide-Si) structure where TaN is used as a material for the gate and $Al_2O_3$ is used as a material for the top insulating layer. Non-Patent Document 3 discloses a BE (Bandgap Engineered)-SONOS structure using a multilevel structure of an oxide film, a nitride film and an oxide film as a tunnel insulating layer.

In a memory cell of any of Non-Patent Documents 1 to 3, write and erase operations are performed by allowing an electric charge to pass through the bottom insulating layer located under a charge storage layer by means of the tunneling phenomenon.

Non-Patent Document 1: Chang-Hyun Lee et al. (Samsung), "Charge Trapping Memory Cell of TANOS (Si-Oxide-SiN—$Al_2O_3$—TaN) Structure Compatible to Conventional NAND Flash Memory," IEEE Nonvolatile Semiconductor Memory Workshop 2006, pp. 54-55

Non-Patent Document 2: Chang-Hyun Lee et al. (Samsung), "A Novel SONOS Structure of $SiO_2$/SiN/$Al_2O_3$ with TaN Metal Gate for Multi-Giga Bit Flash Memories," IEDM 2003 Tech. Digest, pp. 613-616, December 2003

Non-Patent Document 3: Hang-Ting Lue et al. (Macronix), "BE-SONOS: A Bandgap Engineered SONOS with Excellent Performance and Reliability," IEDM 2005 Tech. Digest, pp. 555-558, December 2005

DISCLOSURE OF THE INVENTION

Problems to be Solved by the Invention

In the case where the tunneling phenomenon is utilized to perform write and erase operations as described above, it is necessary to thin the bottom insulating layer in order to facilitate passage of an electric charge through the bottom insulating layer. In this case, however, the electric charge in the charge storage layer is more likely to leak through the bottom insulating layer, resulting in deterioration in data retention characteristic. In particular, when a NAND-type flash memory is read, a high gate voltage has to be applied to a non-selected memory cell. If a bias voltage of approximately 6 V is applied between the well and the gate of the non-selected memory cell, data will be lost in several thousand hours. Thus, the conventional MONOS structure memory using a thin tunnel insulating layer (bottom insulating layer) has a problem that data cannot be retained for a long period of time.

As for the mobility of holes and electrons, holes are lower in mobility than electrons in an oxide film ($SiO_2$). Therefore, if the holes are caused to move in the oxide film, more damages occur in the oxide film as compared with the case where electrons are caused to move in the oxide film. Thus, in the case where the tunneling phenomenon is utilized to perform write and erase operations and the tunnel insulating layer is an oxide film and when a rewrite cycle is repeated, there is a problem that damages are more likely to occur due to hole injection as the tunnel oxide film is thicker, resulting in further deterioration in retention characteristic when a bias voltage is applied.

The present invention has been made in view of the above-described problems, and an object of the invention is to provide a nonvolatile semiconductor memory device excellent in retention characteristic when a bias voltage is applied and suitable for long-term data retention, and to provide an operation method of the nonvolatile semiconductor memory device.

Means for Solving the Problems

A nonvolatile semiconductor memory device of the present invention includes a semiconductor substrate, a first impurity region of a first conductivity type, a second impurity region of a second conductivity type, a first insulating layer, a charge-storage insulating layer, and a gate electrode layer. The semiconductor substrate has a main surface. The first impurity region is formed at the main surface of the semiconductor substrate. The second impurity region is located under the first impurity region. The first insulating layer is formed on the main surface of the semiconductor substrate and on the first impurity region. The charge-storage insulating layer is formed on the first insulating layer. The gate electrode layer is formed on the charge-storage insulating layer. The configuration is used with which an erase operation can be performed by applying a forward bias to the first impurity region and the second impurity region to generate a hot carrier and inject the hot carrier into the charge-storage insulating layer.

An operation method of a nonvolatile semiconductor memory device according to the present invention is an operation method of a nonvolatile semiconductor memory device including a semiconductor substrate having a main surface, a first impurity region of a first conductivity type formed at the main surface of the semiconductor substrate, a second impurity region of a second conductivity type located under the first impurity region, a charge-storage insulating layer formed on the main surface of the semiconductor substrate and on the first impurity region, and a gate electrode layer formed on the charge-storage insulating layer. An erase operation is performed by applying a forward bias to the first impurity region and the second impurity region and applying a voltage to the gate electrode layer to generate a hot carrier and inject the hot carrier into the charge-storage insulating layer.

Effects of the Invention

According to the present invention, an erase operation is performed by applying a forward bias to the first impurity region and the second impurity region to generate hot carriers and inject the hot carriers into the charge-storage insulating layer. Therefore, it is unnecessary, when the erase operation is performed, to inject an electric charge by means of the tunneling phenomenon, and thus the thickness of the first insulating layer under the charge-storage insulating layer can be kept thick. In this way, a good retention characteristic when a bias voltage is applied can be accomplished, and a nonvolatile semiconductor memory device suitable for long-term data retention and an operation method of the nonvolatile semiconductor memory device can be achieved.

DESCRIPTION OF THE REFERENCE SIGNS 1 semiconductor substrate, 1a active region, 1b trench isolation, 2 p-type well region, 2a p$^+$ impurity region, 3 n-type impurity region, 3a n$^+$ impurity region, 4 source/drain region, 5 channel dope region, 6, 6a first insulating layer, 7, 7a charge-storage insulating layer, 8, 8a second insulating layer, 9, 9a third insulating layer, 10, 10a gate electrode layer (word line), 20 gate electrode layer, 21 gate insulating layer, MC memory cell, SG0 bit line side select transistor, SG1 source line side select transistor

BEST MODES FOR CARRYING OUT THE INVENTION

Embodiments of the present invention will be hereinafter described based on the drawings.

First Embodiment

Figure 1:
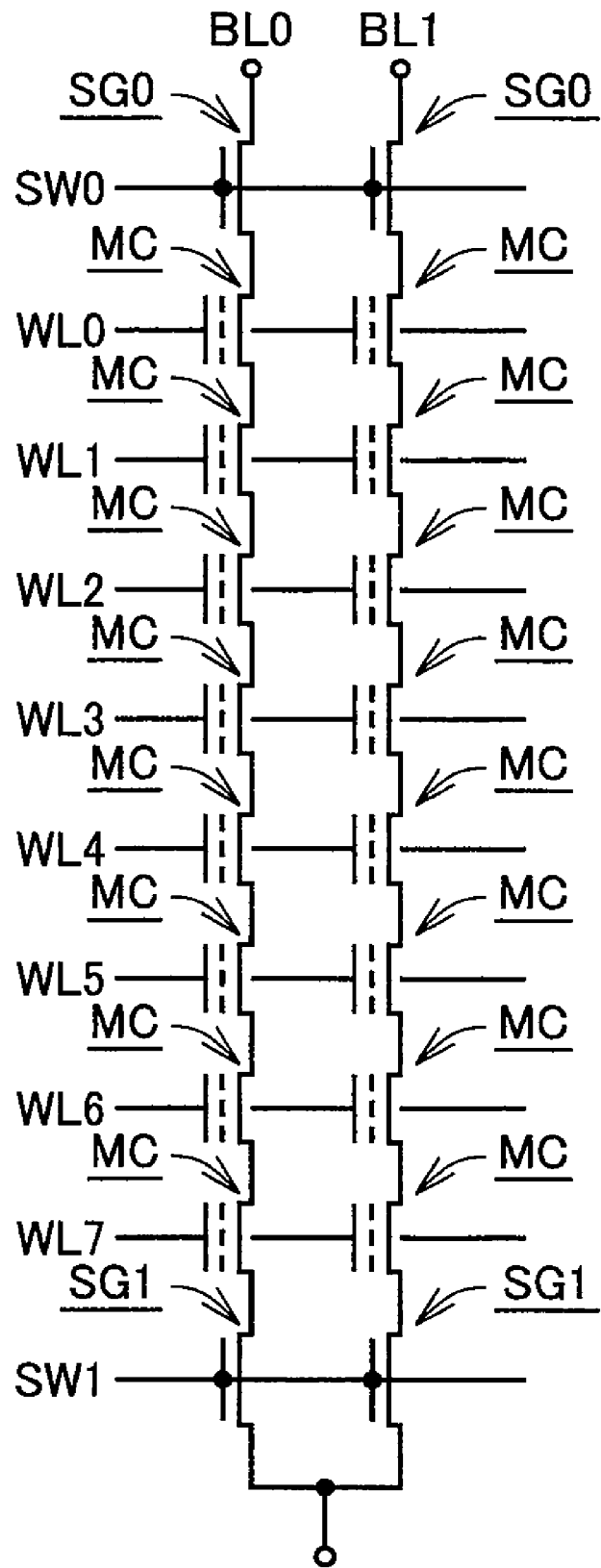
FIG. 1 is a circuit diagram showing a diagrammatic circuit configuration where a nonvolatile semiconductor memory device in a first embodiment of the present invention is applied to a NAND-type flash memory.

FIG. 1 is a circuit diagram showing a diagrammatic circuit configuration where a nonvolatile semiconductor memory device in a first embodiment of the present invention is applied to a NAND-type flash memory. Referring to FIG. 1, in a memory cell array of the NAND-type flash memory, a plurality of memory cells MC are arranged in rows and columns. Respective control gates of memory cells MC located side by side in the row direction (lateral direction in the drawing) are electrically connected to any of word lines WL0-WL7 extending in the row direction.

A plurality of memory cells MC located side by side in the column direction (longitudinal direction in the drawing) are connected in series. To one end of the group of memory cells MC connected in series, a bit line side select transistor SG0 is connected. To the other end, a source line side select transistor SG1 is connected. Respective sources of bit line side select transistors SG0 are connected to bit lines BL0, BL1 that are data lines, and respective sources of source line side select transistors SG1 are connected to a common source line.

Respective gates of bit line side select transistors SG0 located side by side in the row direction are electrically connected to a bit line side select gate line SW0 extending in the row direction. Respective gates of source line side select transistors SG1 located side by side in the row direction are electrically connected to a source line side select gate line SW1 extending in the row direction.

Figure 2:
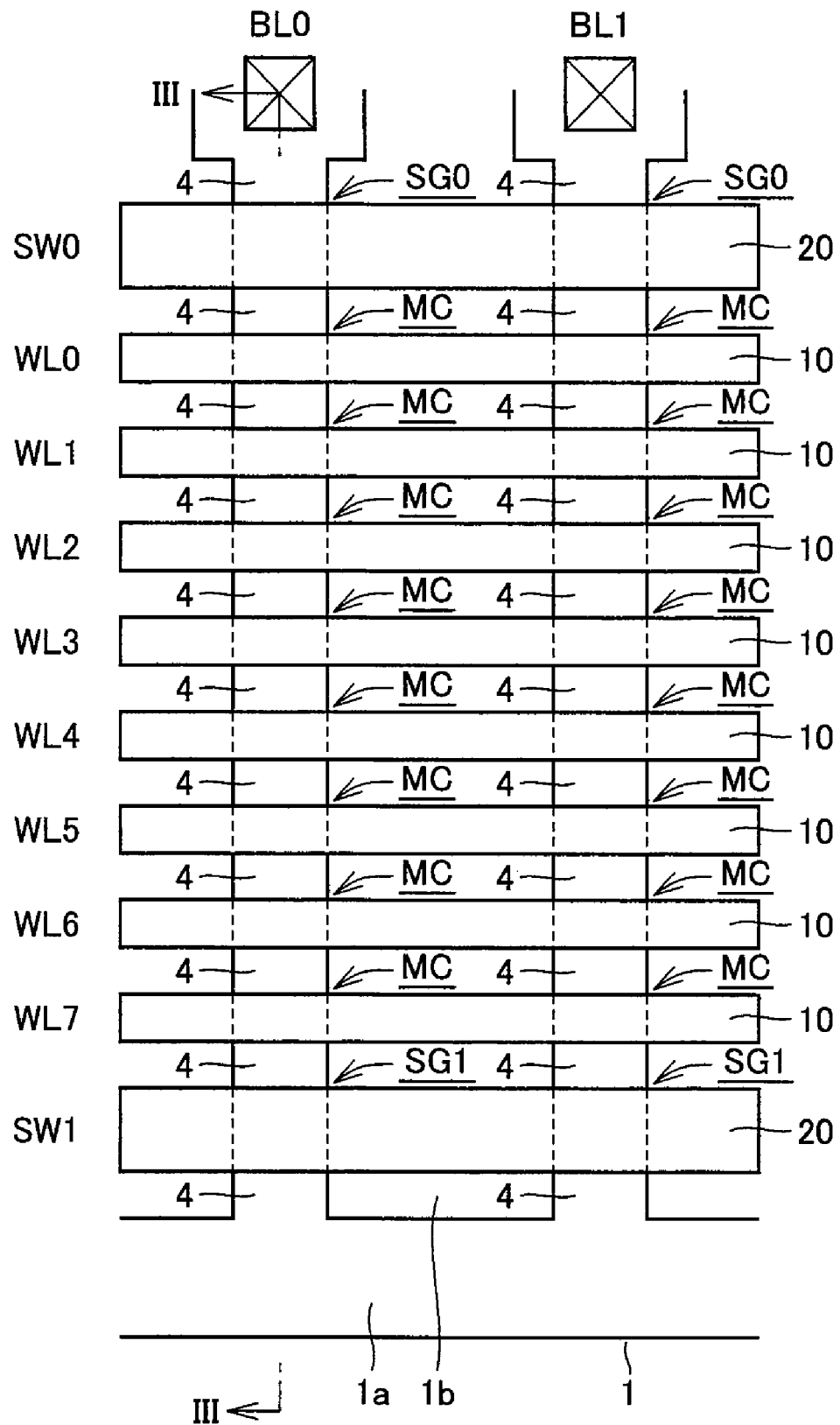
FIG. 2 is a schematic plan view showing a planar layout in a memory cell array of a NAND-type flash memory to which the nonvolatile semiconductor memory device in the first embodiment of the present invention is applied.
Figure 3:
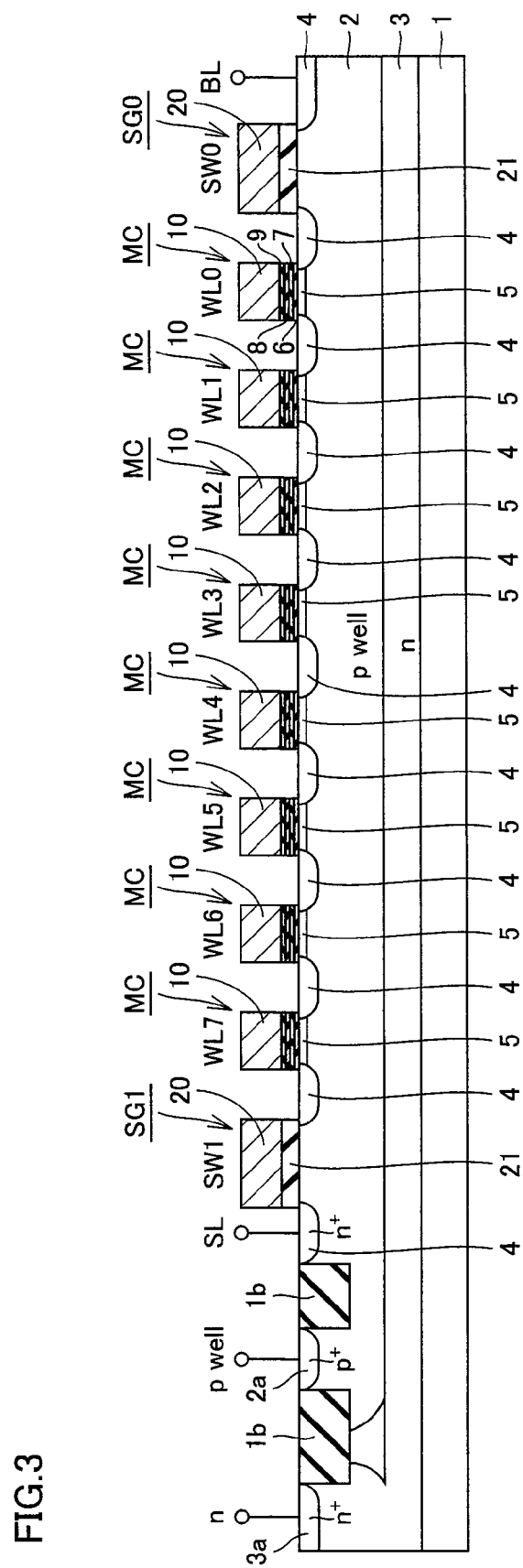
FIG. 3 is a schematic cross section along III-III line in FIG. 2.
Figure 4:
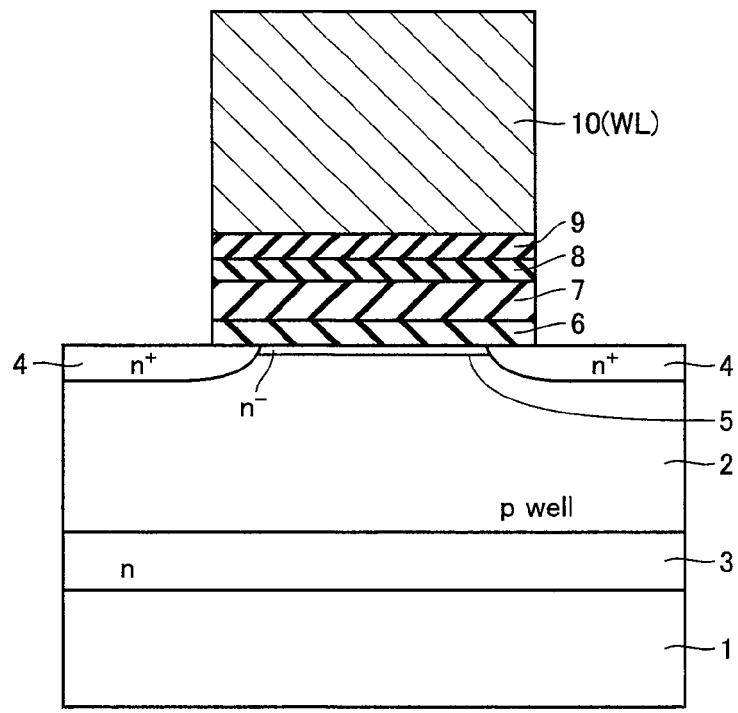
FIG. 4 is an enlarged cross section showing a structure of one memory cell shown in FIG. 3 in an enlarged form.

FIG. 2 is a schematic plan view showing a planar layout in a memory cell array of the NAND-type flash memory to which the nonvolatile semiconductor memory device in the first embodiment of the present invention is applied. FIG. 3 is a schematic cross section along line III-III in FIG. 2. FIG. 4 is an enlarged cross section showing a structure of one memory cell shown in FIG. 3 in an enlarged form.

Referring mainly to FIG. 2, at a surface of a semiconductor substrate 1 made for example of silicon, a plurality of memory cells MC are formed and arranged in rows and columns. A word line 10 integrated with a gate electrode layer of each memory cell MC extends in the row direction (lateral direction in the drawing). On one side (upper side in the drawing) of a plurality of word lines 10, an electrically conductive layer 20 with which a gate electrode layer of each bit line side select transistor SG0 is integrated extends in the row direction (lateral direction in the drawing). On the other side (lower side in the drawing) of a plurality of word lines 10, an electrically conductive layer 20 with which a gate electrode layer of each source line side select transistor SG1 is integrated extends in the row direction (lateral direction in the drawing).

An active region 1a where a source/drain region 4 of each memory cell MC is formed extends in the column direction (longitudinal direction in the drawing). Active region 1a is surrounded at the surface of semiconductor substrate 1 by a device isolation structure such as trench isolation to be electrically isolated from other active regions.

Referring mainly to FIG. 3, at the main surface of semiconductor substrate 1, a well region (first impurity region) 2 of p type for example is formed. An impurity region (second impurity region) 3 of n type for example is formed such that the n-type impurity region is located under this well region 2 and abuts on well region 2. In well region 2, a plurality of memory cells MC, a plurality of bit line side select transistors SG0 and a plurality of source line side select transistors SG1 are formed.

Referring mainly to FIG. 4, a plurality of memory cells MC each include a pair of source/drain regions 4 of n type for example, a channel dope region 5 of n type for example, a first insulating layer 6, a charge-storage insulating layer 7, a second insulating layer 8, a third insulating layer 9, and a gate electrode layer 10.

The paired n-type source/drain regions 4 are formed apart from each other at a surface of p-type well region 2. N-type channel dope region 5 is formed at the surface of p-type well region 2 to connect the paired n-type source/drain regions 4, and is formed to a smaller depth than the pair of n-type source/drain regions 4. N-type channel dope region 5 is formed at the main surface of semiconductor substrate 1 such that memory cell MC is in a depression state while no charge is present in charge-storage insulating layer 7. In other words, n-type channel dope region 5 is formed to electrically connect the paired n-type source/drain regions 4 while no charge is present in charge-storage insulating layer 7. First insulating layer 6 is formed for example of a silicon oxide film, on the main surface of semiconductor substrate 1 and on p-type well region 2 (n-type channel dope region 5) located between the paired n-type source/drain regions 4. Charge-storage insulating layer 7 is formed on first insulating layer 6 and is made of a material (silicon nitride film for example) having a smaller energy bandgap than first insulating layer 6. Gate electrode layer 10 is formed on charge-storage insulating layer 7.

Second insulating layer 8 is formed between charge-storage insulating layer 7 and gate electrode layer 10 and is made of a material (silicon oxide film for example) having a larger energy bandgap than charge-storage insulating layer 7. Third insulating layer 9 is formed between second insulating layer 8 and gate electrode layer 10 and is made of a material (silicon nitride film for example) having a smaller energy bandgap than second insulating layer 8.

Gate electrode layer 10 includes a layer doped with impurities, for example, a polycrystalline silicon layer doped with n-type impurities for example. The layer (polycrystalline silicon layer for example) is doped with the impurities at a concentration that allows a depletion layer to be generated in gate electrode layer 10 as a result of application of a voltage to gate electrode layer 10 when a write operation is performed.

Figure 5:
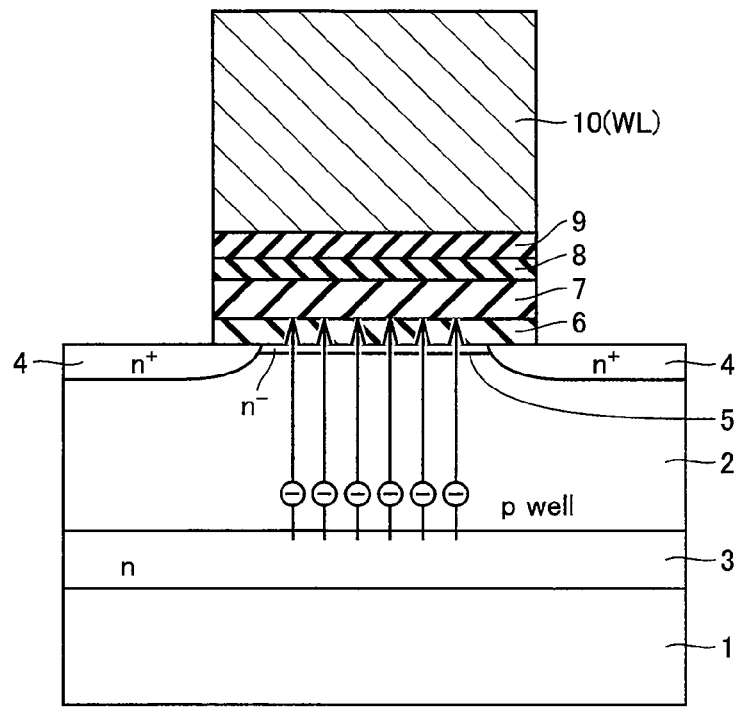
FIG. 5 is a schematic cross section showing a manner of an erase operation.

This memory cell MC is configured as shown in FIG. 5 such that an erase operation can be performed by application of a forward bias to p-type well region 2 and n-type impurity region 3 (namely application of a relatively positive potential to p-type well region 2 and application of a relatively negative potential to n-type impurity region 3) to generate hot carriers (hot electrons for example) and inject the hot carriers into charge-storage insulating layer 7.

Figure 6:
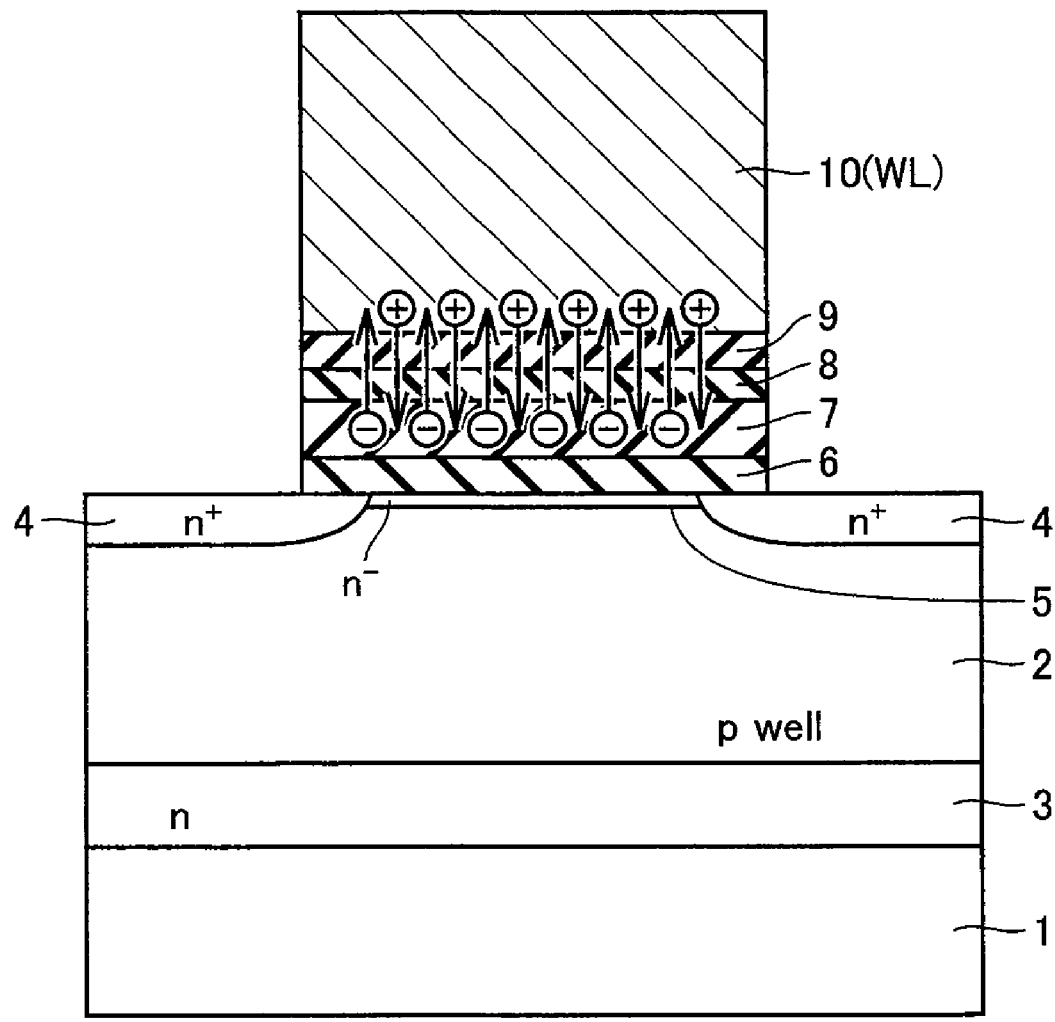
FIG. 6 is a schematic cross section showing a manner of a write operation.

Further, memory cell MC is configured as shown in FIG. 6 such that a write operation can be performed by removal of an electric charge (electrons for example) of charge-storage insulating layer 7 into gate electrode layer 10 and injection of an electric charge (holes for example) having the opposite polarity to the electric charge removed from charge-storage insulating layer 7, from gate electrode layer 10 into charge-storage insulating layer 7.

Referring mainly to FIG. 3, on one side (right side in FIG. 3) of a plurality of memory cells MC, bit line side select transistor SG0 is provided. On the other side (left side in FIG. 3), source line side select transistor SG1 is provided. Bit line side select transistor SG0 and source line side select transistor SG1 each include a pair of source/drain regions 4 of n type for example, a gate insulating layer 21 and a gate electrode layer 20. The paired n-type source/drain regions 4 are formed apart from each other at the surface of p-type well region 2. Gate electrode layer 20 is formed on p-type well region 2 located between the paired n-type source/drain regions 4, with gate insulating layer 21 between gate electrode layer 20 and p-type well region 2.

Of a plurality of memory cells MC, memory cells MC adjacent to each other share one impurity region 4 as a source/drain region. Memory cell MC and bit line side select transistor SG0 adjacent to each other also share one impurity region 4 as a source/drain region, and memory cell MC and source line side select transistor SG1 adjacent to each other also share one impurity region 4 as a source/drain region.

At the main surface of semiconductor substrate 1 and in p-type well region 2, a $p^+$ impurity region 2a is formed, and a potential can be applied to p-type well region 2 via this $p^+$ impurity region 2a. Further, at the main surface of semiconductor substrate 1 and in n-type impurity region 3, an $n^+$ impurity region 3a is formed, and a potential can be applied to n-type impurity region 3 via this $n^+$ impurity region 3a. Between $p^+$ impurity region 2a and source line side select transistor SG1 and between $p^+$ impurity region 2a and $n^+$ impurity region 3a each, a trench isolation 1b for example is formed as a device isolation structure. This trench isolation 1b is formed of a trench made in the surface of semiconductor substrate 1 and an insulating layer filling the inside of the trench.

In the following, an operation method of the nonvolatile semiconductor memory device in the present embodiment will be described. An erase operation will be described first.

Figure 7:
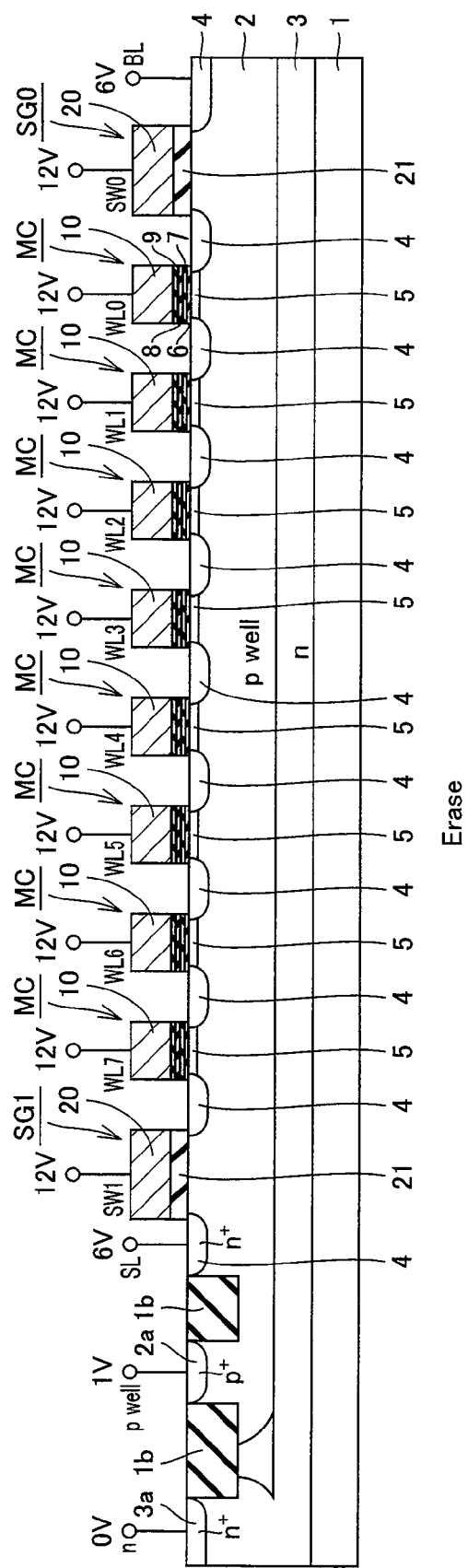
FIG. 7 is a schematic cross section showing a state of voltage application to each element when the erase operation is performed.
Figure 8:
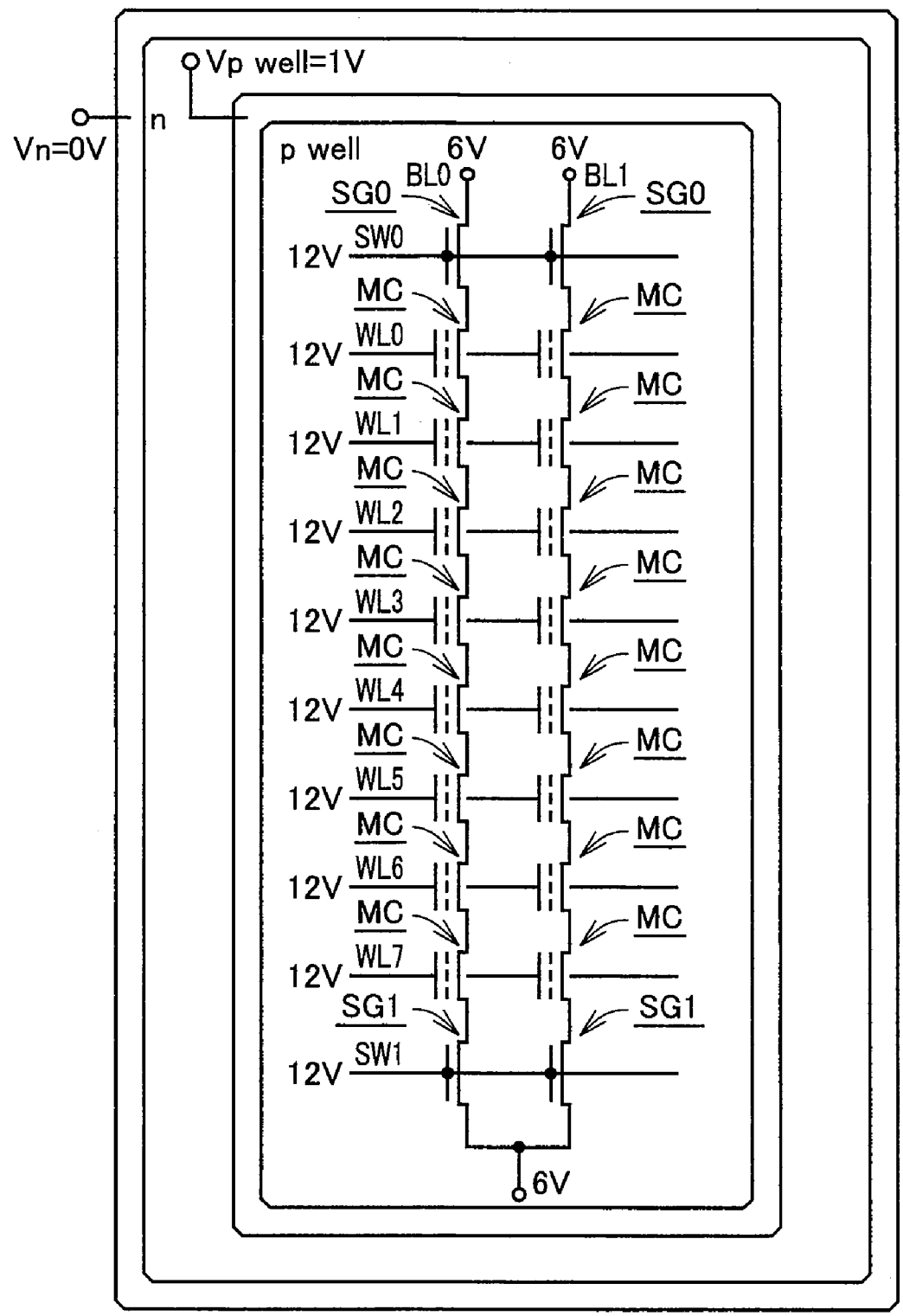
FIG. 8 is a diagrammatic plan view showing a state of voltage application to each element when the erase operation is performed.

FIGS. 7 and 8 are respectively a schematic cross section and a diagrammatic plan view showing a state of voltage application to each element when the erase operation is performed. Referring to FIGS. 7 and 8, when the erase operation is performed, 1 V for example is applied to p-type well region 2, and 0 V for example is applied to n-type impurity region 3. Further, 12 V for example is applied to all word lines 10, and respective gate electrode layers 20 of bit line side select transistor SG0 and source line side select transistor SG1. 6 V for example is applied to each bit line and 6 V for example is applied to the source line.

Accordingly, as shown in FIG. 5, a forward bias is applied to p-type well region 2 and n-type impurity region 3 to cause electrons to be injected from n-type impurity region 3 into p-type well region 2. The electrons are accelerated and accordingly hot electrons are generated because of a potential difference between the potential (1 V) of p-type well region 2 and the potential (6 V) of n-type channel dope region 5. The hot electrons are injected into charge-storage insulating layer 7 because of a potential difference between the potential (6V) of channel dope region 5 and the potential (12 V) of gate electrode layer 10. In this way, all memory cells MC formed in the same p-type well region 2 become an erased state (positive threshold voltage).

A write operation will be described next.

Figure 9:
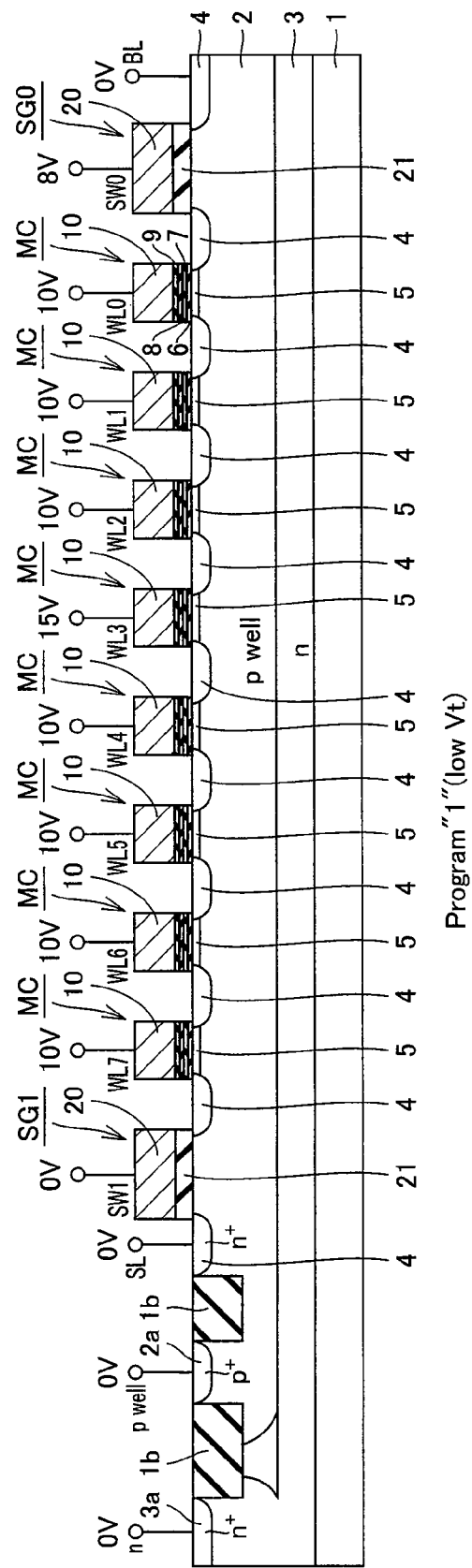
FIG. 9 is a schematic cross section for a selected bit, showing a state of voltage application to each element when the write operation is performed.
Figure 10:
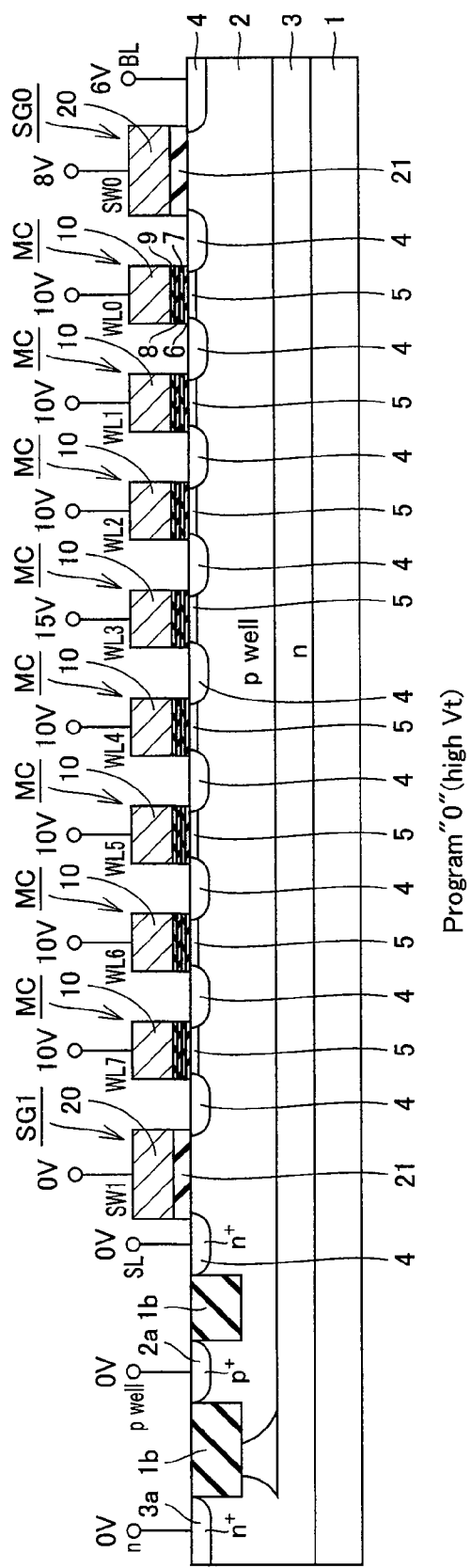
FIG. 10 is a schematic cross section for a non-selected bit, showing a state of voltage application to each element when the write operation is performed.
Figure 11:
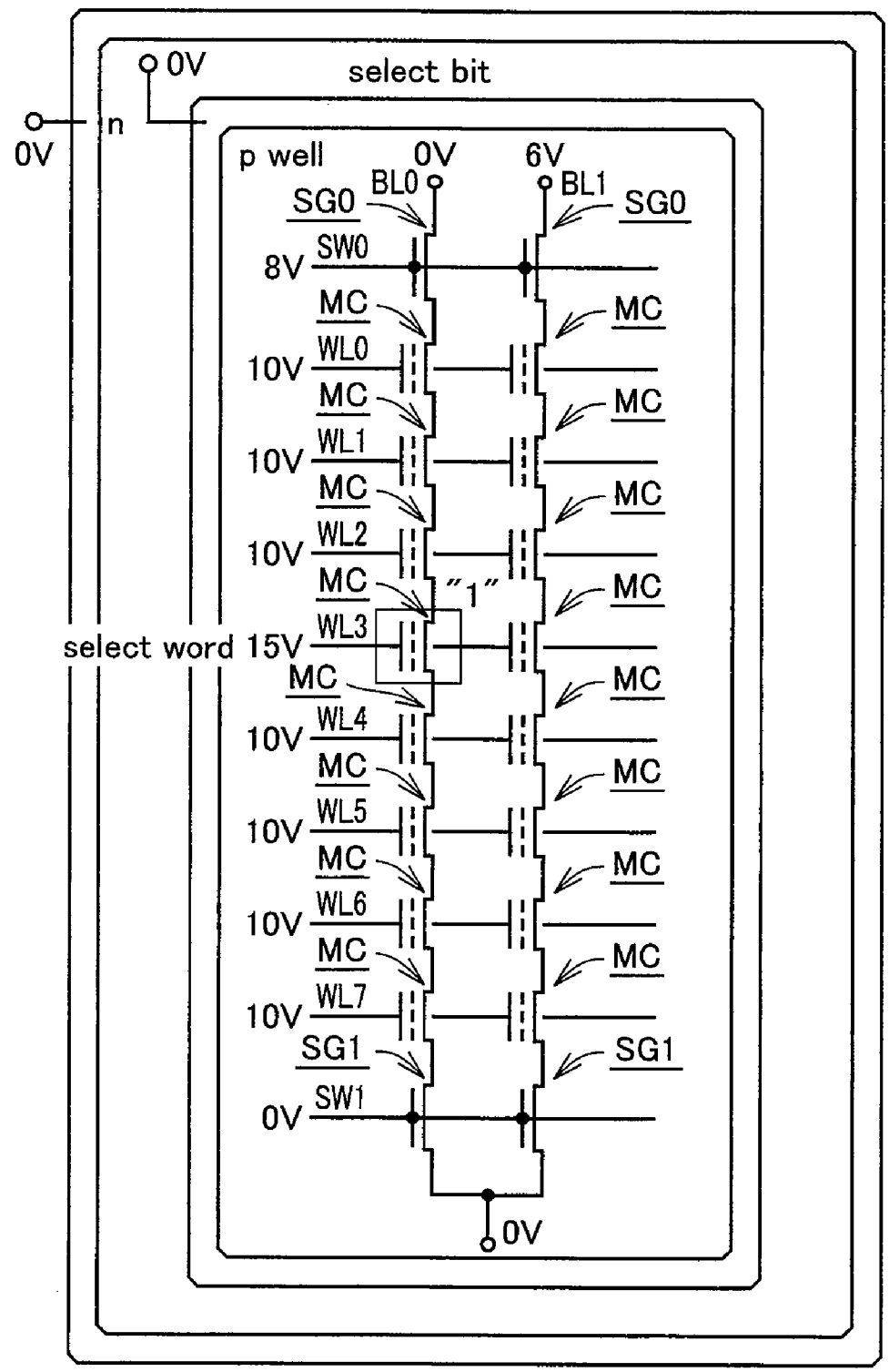
FIG. 11 is a diagrammatic plan view showing a state of voltage application to each element when the write operation is performed.

FIGS. 9 and 10 are schematic cross sections for a selected bit and a non-selected bit respectively, showing a state of voltage application to each element when the write operation is performed. FIG. 11 is a diagrammatic plan view showing a state of voltage application to each element when the write operation is performed.

Referring to FIGS. 9 and 11, when the write operation is performed, 0 V for example is applied to p-type well region 2, and 0 V for example is applied to n-type impurity region 3. 15 V for example is applied to a selected word line 10, and 10 V for example is applied to a non-selected word line 10. 8 V for example is applied to gate electrode layer 20 of bit line side select transistor SG0, and 0 V for example is applied to gate electrode layer 20 of source line side select transistor SG1. Further, 0 V for example is applied to a selected bit line, and 0V for example is applied to the source line.

Referring to FIGS. 10 and 11, when the write operation is performed, 6 V for example is applied to a non-selected bit line. Respective voltages applied to other elements are identical to the voltages shown in FIG. 9, and the description thereof will not be repeated.

Accordingly, as shown in FIGS. 9 and 11, the potential of n-type channel dope region 5 of memory cell MC connected to the selected bit is 0 V. Thus, in selected memory cell MC located at the intersection of the selected bit line and the selected word line 10, there is a large potential difference of 15 V between the potential (0 V) of n-type channel dope region 5 and the potential (15 V) of gate electrode layer 10 so that a electric field is applied to multi-layer films 6 to 9 between n-type channel dope region 5 and gate electrode layer 10. A depletion layer is generated in selected word line 10.

The electric field as described above causes, as shown in FIG. 6, the electrons in charge-storage insulating layer 7 to be removed into gate electrode layer 10 and causes the holes in gate electrode layer 10 to be injected into charge-storage insulating layer 7 by means of the tunneling phenomenon. In this way, selected memory cell MC becomes a written state (negative threshold voltage).

At this time, for the selected bit in writing as shown in FIGS. 9 and 11, the selected bit line is set to 0 V so that the potential of n-type channel dope region 5 is fixed at 0 V. In contrast, for the non-selected bit in writing as shown in FIGS. 10 and 11, the non-selected bit line is set to 6 V so that the potential of n-type channel dope region 5 is raised to 6 V to reduce the electric field applied to insulating layers 6 to 9. The write operation is thus inhibited.

Through the above-described erase and write operations, memory cells MC are programmed to the positive threshold voltage state "0" and the negative threshold voltage state "1".

A read operation will be described next.

Figure 12:
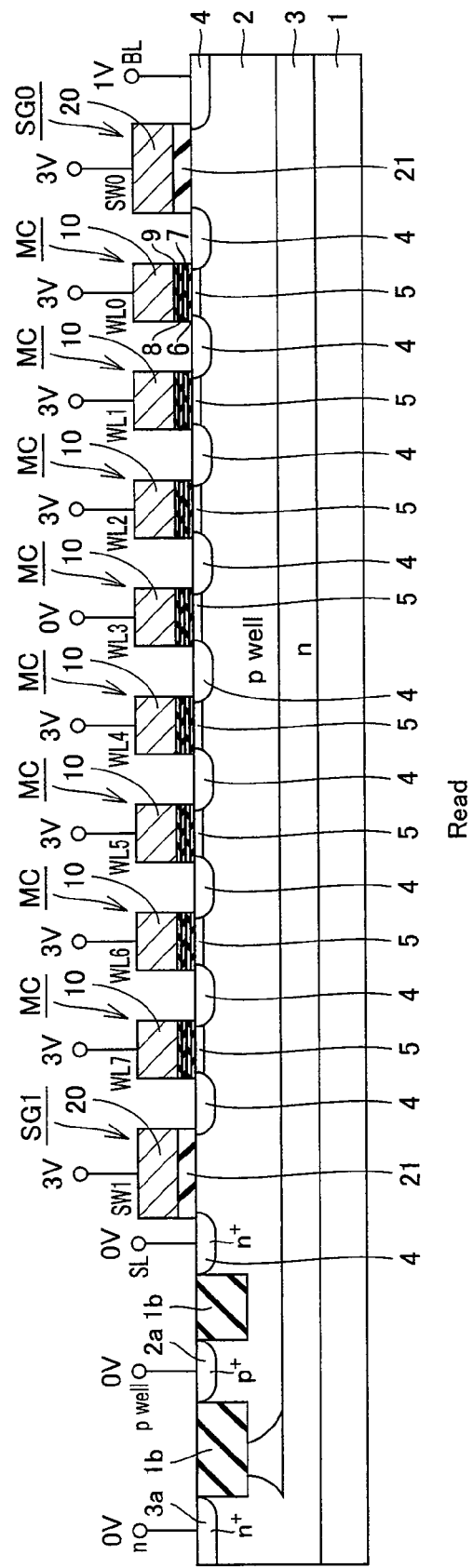
FIG. 12 is a schematic cross section showing a state of voltage application to each element when a read operation is performed.
Figure 13:
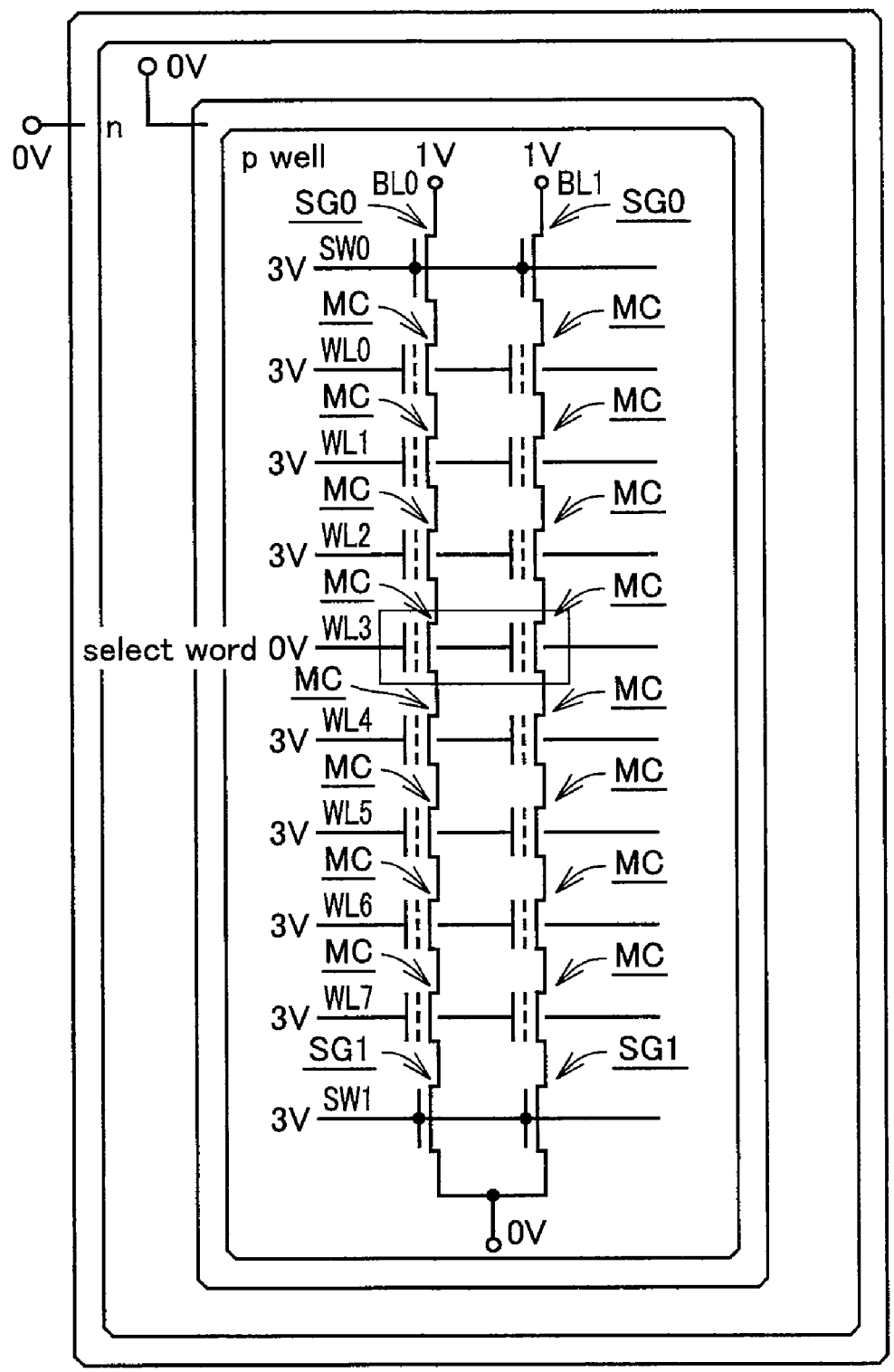
FIG. 13 is a diagrammatic plan view showing a state of voltage application to each element when the read operation is performed.

FIGS. 12 and 13 are a schematic cross section and a diagrammatic plan view respectively, showing a state of voltage application to each element when the read operation is performed. Referring to FIGS. 12 and 13, when the read operation is performed, 0 V for example is applied to each of p-type well region 2 and n-type impurity region 3. Further, 0 V for example is applied to a selected word line 10. 3 V for example is applied to a non-selected word line 10, and respective gate electrode layers 20 of bit line side select transistor SG0 and source line side select transistor SG1. 1 V for example is applied to each bit line and 0 V for example is applied to the source line.

Figure 14:
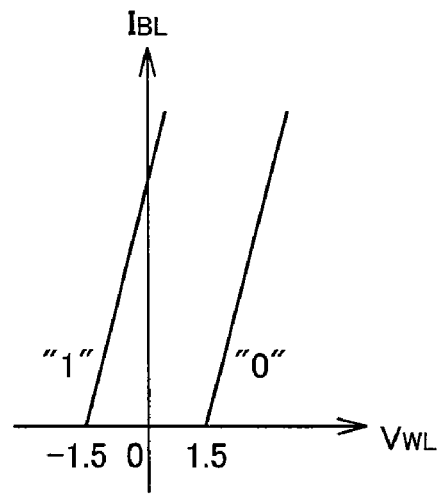
FIG. 14 is a diagram showing a change of electric current IBL flowing through a bit line when a voltage VWL applied to a word line is changed.

Accordingly, non-selected memory cell MC connected to non-selected word line 10 becomes an electrically conductive state. Since potential $V_{WL}$ of selected word line 10 is zero, as shown in FIG. 14, selected memory cell MC connected to selected word line 10 becomes an electrically conductive state when the memory cell is in the negative threshold voltage state "1" so that current $I_{BL}$ flows in the bit line, and becomes an electrically non-conductive state when the memory cell is in the positive threshold voltage state "0." Whether the state is "1" or "0" is thus determined to read the information.

In the following, the functions and effects of the present embodiment will be described.

Figure 15:
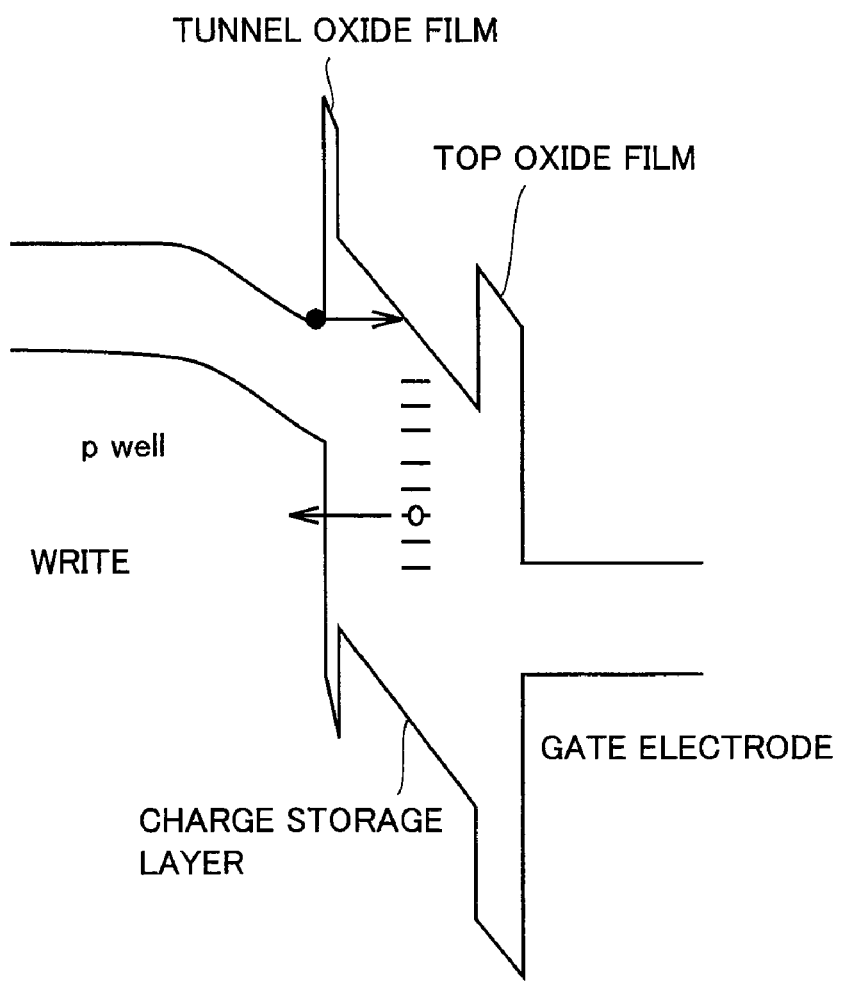
FIG. 15 is a band diagram showing a state when a write operation is performed in a conventional nonvolatile semiconductor memory device.

In the case where the electric charge is injected/removed by means of the tunneling phenomenon as done in the conventional example, as shown in the band diagram of FIG. 15, the tunnel oxide film has to be made thin in order to facilitate passage of electrons (black circle in the drawing) and holes (white circle in the drawing) through the tunnel oxide film. If the tunnel oxide film is made thin, however, electrons or holes in the charge-storage insulating layer are more likely to directly tunnel through the tunnel oxide film and leak, and thus the data retention characteristic is deteriorated.

Figure 16:
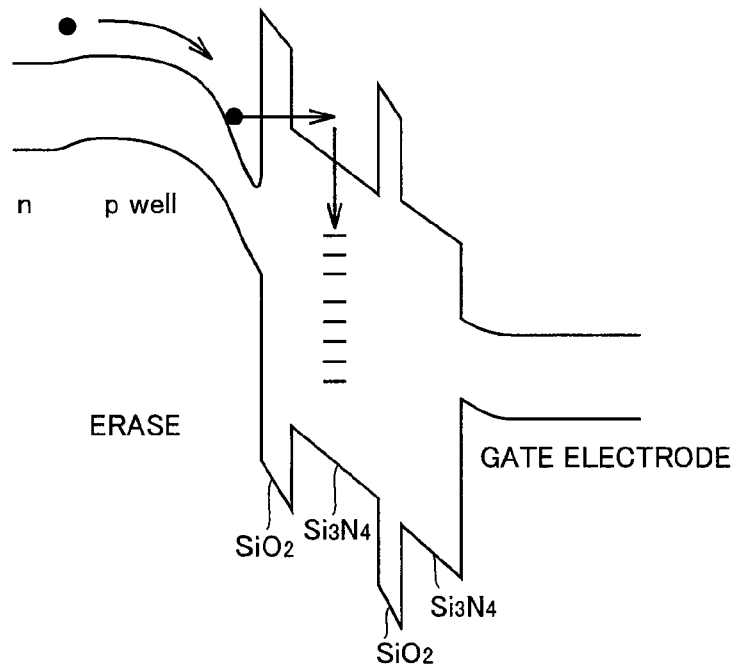
FIG. 16 is a band diagram showing a state when the erase operation is performed in the nonvolatile semiconductor memory device in the first embodiment of the present invention.

In contrast, according to the present embodiment, a forward bias is applied to p-type well region 2 and n-type impurity region 3, so that hot electrons are generated and injected into charge-storage insulating layer 7, and accordingly the erase operation is performed as shown in the band diagram of FIG. 16. Therefore, it is unnecessary to inject an electric charge by means of the FN (Fowler-Nordheim) tunneling phenomenon when the erase operation is performed, and therefore, the thickness of first insulating layer 6 under charge-storage insulating layer 7 can be kept thick. In this way, a good retention characteristic when a bias voltage is applied can be accomplished, and the nonvolatile semiconductor memory device suitable for long-term data retention and the operation method of the nonvolatile semiconductor memory device can be achieved.

Figure 17:
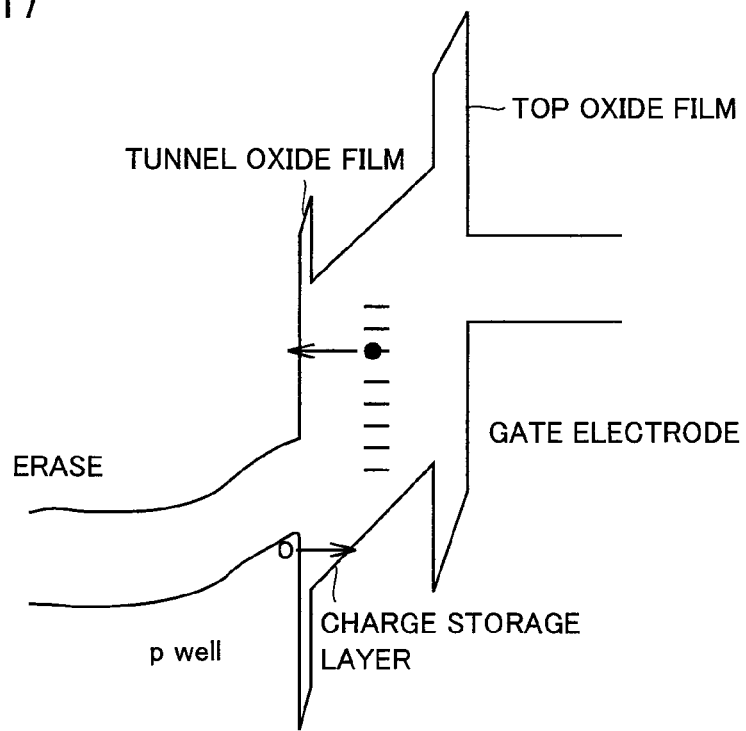
FIG. 17 is a band diagram showing a state when an erase operation is performed in the conventional nonvolatile semiconductor memory device.

Further, in the case where holes are injected by means of the tunneling phenomenon as done in the conventional example, as shown in the band diagram of FIG. 17, holes (white circle in the drawing) pass through the tunnel oxide film. Even if the tunnel oxide film is made thick for improving the data retention characteristic, a damage such as trapping of a hole in the oxide film is more likely to occur as the tunnel oxide film is thicker, because the mobility of the hole in the oxide film is extremely lower than the electron, resulting in undesirable deterioration in retention characteristic when the bias voltage is applied.

Figure 18:
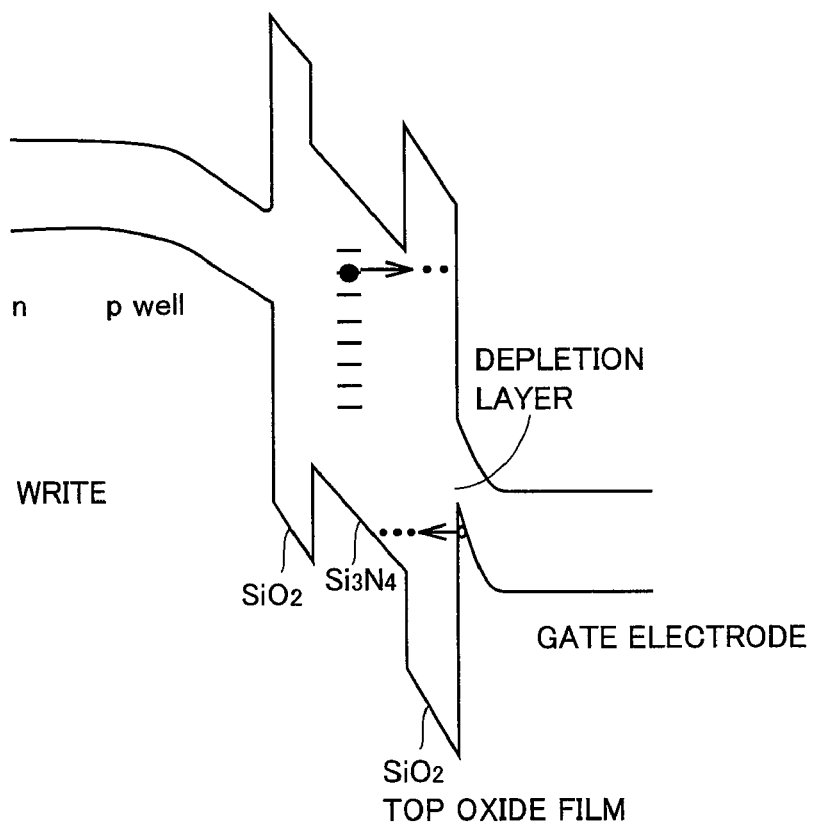
FIG. 18 is a band diagram showing a manner in which a write operation is performed by injecting a hole from a gate electrode layer into a charge-storage insulating layer in the conventional nonvolatile semiconductor memory device.

In the case of the conventional example, as shown in the band diagram of FIG. 18, if holes are to be injected from the gate electrode layer side, a high potential barrier due to the top oxide film (charge block layer) on the charge-storage insulating layer hinders holes from being injected into the charge-storage insulating layer.

Figure 19:
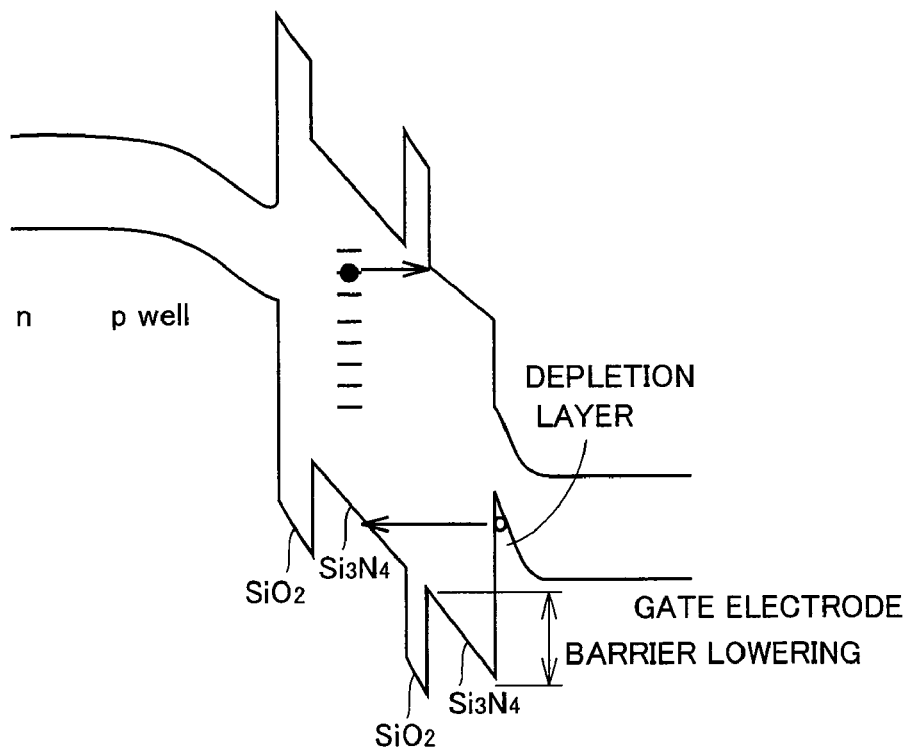
FIG. 19 is a band diagram showing a state when the write operation is performed in the nonvolatile semiconductor memory device in the first embodiment of the present invention.

In contrast, according to the present embodiment, as shown in the band diagram of FIG. 19, electrons in charge-storage insulating layer 7 are removed into gate electrode layer 10 while holes in gate electrode layer 10 are injected into charge-storage insulating layer 7. In the present embodiment, unlike the conventional example, holes do not pass through first insulating layer 6 under charge-storage insulating layer 7. Therefore, even if first insulating layer 6 is made thick, the damage due to passage of holes does not occur to first insulating layer 6. In this way, degradation of the retention characteristic when the bias voltage is applied is prevented so that the rewrite resistance can be improved.

Further, according to the present embodiment, third insulating layer 9 is formed on second insulating layer 8, and this third insulating layer 9 is made of a material of a smaller energy bandgap than second insulating layer 8. Third insulating layer 9 is thus provided to effectively lower the height of the potential barrier of second insulating layer 8 as shown in the band diagram of FIG. 19 and therefore, holes can be injected into charge-storage insulating layer 7 by means of the tunneling.

The following document indicates that the multi-layer structure as described above is provided to increase the electric-field dependency of the tunneling probability.

Document: Konstantin K. Likharev, "Layered tunnel barriers for nonvolatile memory devices," Appl. Phys. Letters, 73 (1998), pp. 2137-2139

Further, in the present embodiment, second insulating layer 8 made of a material having a larger energy bandgap than charge-storage insulating layer 7 is formed on charge-storage insulating layer 7. The leakage current in a low electric field can thus be reduced.

In the present embodiment, since gate electrode layer 10 includes the polycrystalline silicon layer doped with n-type impurities and the layer is doped with the impurities at a concentration that causes a depletion layer to be generated in gate electrode layer 10 when the write operation is performed, holes generated in this depletion layer can be efficiently injected into charge-storage insulating layer 7.

While a polycrystalline silicon layer doped with p-type impurities may be used for gate electrode layer 10 in order to promote injection of holes, a disadvantage occurs in this case that is an increase in initial threshold voltage of the memory.

In the present embodiment, channel dope region 5 is formed at the main surface of semiconductor substrate 1 so that a depression state is achieved while there is no charge in charge-storage insulating layer 7. Therefore, it is unnecessary to excessively inject holes into charge-storage insulating layer 7 in order to achieve a written state (negative threshold voltage state). While a considerable damage occurs to silicon oxide film 8 if holes are allowed to pass through silicon oxide film (second insulating layer) 8 for excessively injecting the holes as described above, the present embodiment does not require excessive injection of holes, so that such a damage can be prevented from occurring.

Second Embodiment

Figure 20:
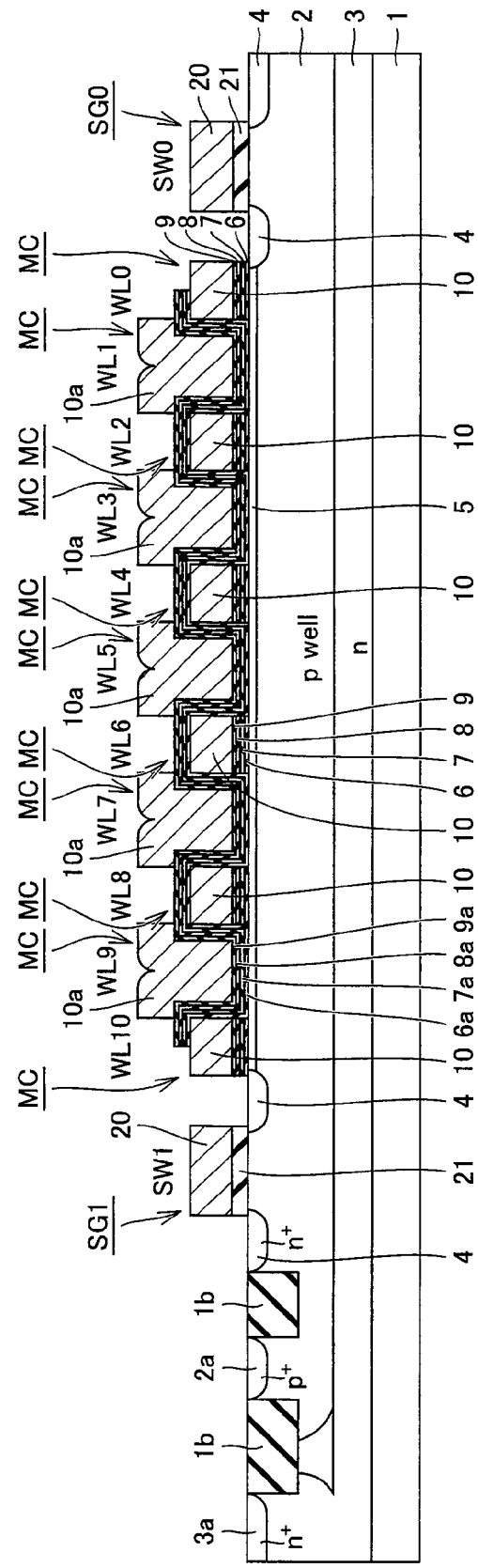
FIG. 20 is a schematic cross section corresponding to line III-III in FIG. 2, schematically showing a configuration of a nonvolatile semiconductor memory device in a second embodiment of the present invention.

FIG. 20 is a schematic cross section corresponding to line III-III in FIG. 2, schematically showing a configuration of a nonvolatile semiconductor memory device in a second embodiment of the present invention. Referring to FIG. 20, the configuration or the present embodiment differs from the configuration of the first embodiment in terms of the memory cell structure.

In memory cell MC of the first embodiment, n-type impurities are ion-implanted after the memory gate is formed so as to produce the $n^+$ impurity diffusion layer as a source/drain between the memory gates. In contrast, in memory cell MC of the present embodiment, a first memory gate 10 is processed and thereafter MONOS multi-layer films 6a to 9a and a gate polycrystalline silicon layer 10a are deposited and processed to embed second memory gate 10a between first memory gates 10.

Memory cell MC of the present embodiment having first memory gate 10 differs from the structure of memory cell MC of the first embodiment in that a pair of n-type source/drain regions 4 is shared by a plurality of memory cells MC connected in series in the column direction (longitudinal direction in FIG. 1).

Further, memory cell MC having second memory gate 10a includes a channel dope region 5 of n type for example, a pair of source/drain regions 4 of n type for example, MONOS multi-layer films 6a to 9a, and second memory gate 10a.

Channel dope region 5 is formed at the main surface of semiconductor substrate 1 and at a surface of p-type well region 2, and is formed such that the channel dope region becomes a depression state while no electric charge is present in charge-storage insulating layer 7. Further, this channel dope region 5 is formed integrally with channel dope region 5 of memory cell MC having first memory gate 10.

A pair of n-type source/drain regions 4 is shared with n-type source/drain regions 4 of memory cells MC having first memory gate 10. Specifically, a pair of source/drain regions 4 is shared by a plurality of memory cells MC having the first memory gate and a plurality of memory cells MC having the second memory gate.

MONOS multi-layer films 6a to 9a are formed to cover the top surface and the side surface of first memory gate 10 and the main surface of semiconductor substrate 1 between first memory gates 10. MONOS multi-layer films 6a to 9a include a first insulating layer 6a, a charge-storage insulating layer 7a, a second insulating layer 8a and a third insulating layer 9a stacked on each other one after another. First insulating layer 6a is made of a material similar to that of first insulating layer 6, charge-storage insulating layer 7a is made of a material similar to that of charge-storage insulating layer 7, second insulating layer 8a is made of a material similar to that of second insulating layer 8, and third insulating layer 9a is made of a material similar to that of third insulating layer 9.

Second memory gate 10a is formed on MONOS multi-layer films 6a to 9a to fill the space between first memory gates 10. Second memory gate 10a is made of a material similar to that of first memory gate 10.

Memory cell MC having first memory gate 10 and memory cell MC having second memory gate 10a are each configured to be able to perform an erase operation by applying a forward bias to p-type well region 2 and n-type impurity region 3 to generate hot electrons and inject the hot electrons into charge-storage insulating layer 7.

Further, memory cell MC having first memory gate 10 and memory cell MC having second memory gate 10a are each configured to be able to perform a write operation by removing an electric charge (electrons) of charge-storage insulating layer 7 into gate electrode layer 10 and injecting an electric charge (holes) of the opposite polarity to the electric charge removed from charge-storage insulating layer 7, from gate electrode layer 10 into charge-storage insulating layer 7.

Since the structure of the present embodiment is substantially identical to the above-described first embodiment except for these features described above, and therefore, like components are denoted by like reference characters and the description thereof will not be repeated.

Regarding an operation method (erase, write, read) of the nonvolatile semiconductor memory device in the present embodiment, respective voltages similar to those of the first embodiment are applied to respective elements.

According to the present embodiment, since charge-storage insulating layers 7, 7a are used and an electrically-conductive floating gate is not used, it is unnecessary to consider ensured reliability of the insulating film between floating gates adjacent to each other. Further, since the ensured reliability of the insulating film between floating gates adjacent to each other is unnecessary to consider, charge-storage insulating layers 7, 7a can be disposed closer to each other and accordingly the density can be easily increased.

While the above description of the first and second embodiments has been given about the case where impurity region 3, source/drain region 4 and channel dope region 5 are n type and well region 2 is p type, operations similar to the above-described ones can be performed even in the case where these regions have the opposite polarity. In this case, for the erase operation, a forward bias is applied to the n-type well region 2 and the p-type impurity region to generate hot holes and inject the hot holes into charge-storage insulating layer 7.

Further, while the above description of the first and second embodiments has been given about the case where first insulating layer 6 is a silicon oxide film, charge-storage insulating layer 7 is a silicon nitride film, second insulating layer 8 is a silicon oxide film, and third insulating layer 9 is a silicon nitride film, respective materials for first insulating layer 6, charge-storage insulating layer 7, second insulating layer 8, and third insulating layer 9 are not limited to them. First insulating layer 6 and second insulating layer 8 may be made of any material having a larger energy bandgap than charge-storage insulating layer 7, and third insulating layer 9 may be made of a material having a smaller energy bandgap than second insulating layer 8.

Furthermore, the above-description of the first and second embodiments has been given about the case where the number of word lines is eight, the present invention is not limited to this and the number of word lines may be appropriately changed.

It should be noted that, in FIGS. 8, 11 and 13, a planar layout diagram and a circuit diagram are combined for convenience of description about a voltage application manner.

It should be construed that embodiments disclosed herein are by way of illustration in all respects, not by way of limitation. It is intended that the scope of the present invention is defined by claims, not by the above description, and includes all modifications and variations equivalent in meaning and scope to the claims.

INDUSTRIAL APPLICABILITY

The present invention is advantageously applicable to a nonvolatile semiconductor memory device performing erase and write operations by injecting and removing an electric charge into and from a charge-storage insulating layer, particularly to a large-capacity NAND-type flash memory.

The invention claimed is:

1. A nonvolatile semiconductor memory device comprising:
   a semiconductor substrate having a main surface;
   a first impurity region of a first conductivity type formed at the main surface of said semiconductor substrate;
   a second impurity region of a second conductivity type located under said first impurity region;
   a first insulating layer formed on the main surface of said semiconductor substrate and on said first impurity region;
   a charge-storage insulating layer formed on said first insulating layer; and
   a gate electrode layer formed on said charge-storage insulating layer;
   a second insulating layer formed between said charge-storage insulating layer and said gate electrode layer and made of a material having a larger energy bandgap than said charge-storage insulating layer; and
   a third insulating layer formed between said second insulating layer and said gate electrode layer and made of a material having a smaller energy bandgap than said second insulating layer,
   said nonvolatile semiconductor memory device being configured to be able to perform an erase operation by applying a forward bias to said first impurity region and said second impurity region to generate a hot carrier and inject the hot carrier into said charge-storage insulating layer.

2. The nonvolatile semiconductor memory device according to claim 1, wherein
   said nonvolatile semiconductor memory device is configured to be able to perform a write operation by removing an electric charge of said charge-storage insulating layer into said gate electrode layer and injecting from said gate electrode layer into said charge-storage insulating layer an electric charge of a polarity opposite to the electric charge removed from said charge-storage insulating layer.

3. The nonvolatile semiconductor memory device according to claim 1, wherein
   said gate electrode layer includes a layer doped with an impurity, and said gate electrode layer is doped with said impurity at a concentration that causes a depletion layer to be generated in said gate electrode layer when said write operation is performed.

4. The nonvolatile semiconductor memory device according to claim 1, further comprising a channel dope region formed at the main surface of said semiconductor substrate such that a depression state is accomplished while no electric charge is present in said charge-storage insulating layer.

5. An operation method of a nonvolatile semiconductor memory device including a semiconductor substrate having a main surface, a first impurity region of a first conductivity type formed at the main surface of said semiconductor substrate, a second impurity region of a second conductivity type located under said first impurity region, a charge-storage insulating layer formed on the main surface of said semiconductor substrate and on said first impurity region, a gate electrode layer formed on said charge-storage insulating layer, a first insulating layer formed between said charge-storage insulating layer and said gate electrode layer and made of a material having a larger energy bandgap than said charge-storage insulating layer, and a second insulating layer formed between said first insulating layer and said gate electrode layer and made of a material having a smaller energy bandgap than said first insulating layer, said nonvolatile semiconductor memory device performing an erase operation by applying a forward bias to said first impurity region and said second impurity region and applying a voltage to said gate electrode layer to generate a hot carrier and inject said hot carrier into said charge-storage insulating layer.

6. The operation method of a nonvolatile semiconductor memory device according to claim 5, wherein said nonvolatile semiconductor memory device performs a write operation by applying a voltage to said gate electrode layer to remove an electric charge of said charge-storage insulating layer into said gate electrode layer, and inject from said gate electrode layer into said charge-storage insulating layer an electric charge of a polarity opposite to the electric charge removed from said charge-storage insulating layer.

* * * * *